United States Patent [19]
Zhang et al.

[11] Patent Number: 5,645,645
[45] Date of Patent: Jul. 8, 1997

[54] METHOD AND APPARATUS FOR PLASMA TREATMENT OF A SURFACE

[75] Inventors: Jie Zhang, East Lansing; Jes Asmussen, Okemos, both of Mich.

[73] Assignee: Board of Trustees operating Michigan State University, East Lansing, Mich.

[21] Appl. No.: 672,456

[22] Filed: Jun. 28, 1996

Related U.S. Application Data

[62] Division of Ser. No. 418,383, Apr. 7, 1995, Pat. No. 5,571,577.

[51] Int. Cl.$^6$ ................................................ C23C 16/00
[52] U.S. Cl. ........................ 118/723 MW; 118/723 MR; 118/723 ME
[58] Field of Search ........................... 118/723 MW, 118/723 MR, 723 MA, 723 ME, 723 MP; 427/575; 204/298.38; 216/29; 156/345

[56] References Cited

U.S. PATENT DOCUMENTS

| | | | |
|---|---|---|---|
| 4,440,108 | 4/1984 | Little et al. | 118/719 |
| 4,778,561 | 10/1988 | Ghanbari | 156/643 |
| 4,820,371 | 4/1989 | Rose | 156/345 |
| 4,859,303 | 8/1989 | Kalnitsky et al. | 204/192.36 |
| 5,217,559 | 6/1993 | Moslehi et al. | 156/345 |
| 5,248,371 | 9/1993 | Maher et al. | 156/345 |
| 5,545,258 | 8/1996 | Katayama et al. | 118/723 MP |

OTHER PUBLICATIONS

Spitsyn, B. V., et al., J. Cryst. Gowth 52 219 (1981).
Matsumoto, S., et al., Jpn. J. Appl. Phys. 21 part 2, 183 (1982).
Matsumoto, S., et al., J. Mater. Sci. 17 3106 (1982).
Kamo, M., et al., J. Cryst. Growth 62 642 (1983).
Matsumoto, S., et al., J. Mater. Sci, 18 1785 (1983).
Matsumoto, S., J. Mater. Sci. Lett., 4 600 (1985).
Matsumoto, S., et al., Appl. Phys. Lett., 51 737 (1987).
Suzuki, K., et al., Appl. Phys. Lett., 50 728 (1987).
Zhu, W., et al., Proc. IEEE 79, No. 5, 621 (1991).
Matsumoto, et al., Jpn. J. Appl. Phys. 29 2082 (1990).
Mitsuda, Y., et al., Rev. Sci. Instrum. 60 249 (1989).
Takeuchi, et al., J. Appl. Phys. 71 2636 (1992).
Zhu, et al, Growth and Characterization of Diamond Film on Nondiamond Substrates for Electronic Applications, Proceedings of the IEEE, vol. 79, No. 5, pp. 621–624 (1991).
Bunday, F. P., et al., "Man-made diamond," Nature 176 51 (1955).
Angus, J. C., et al., J. Appl. Phys. 39 2915 (1968).
Deryaguin, B. V., et al., J. Cryst. Growth 2 380 (1968).

*Primary Examiner*—John Niebling
*Assistant Examiner*—Joni Y. Chang
*Attorney, Agent, or Firm*—Ian C. McLeod

[57] ABSTRACT

A radiofrequency wave apparatus and method which provides a relatively high concentration of reactive species from a plasma for the treatment of a surface particularly of a substrate (31) with a complex geometry in a holder (62) which masks a portion of the substrate. The radiofrequency waves are preferably microwaves or UHF waves. The apparatus and method is particularly useful for rapid plasma assisted chemical vapor deposition of diamond on a portion of the substrate, particularly on surfaces of objects with complex geometries such as a drill (60) or a seal ring (64).

9 Claims, 8 Drawing Sheets

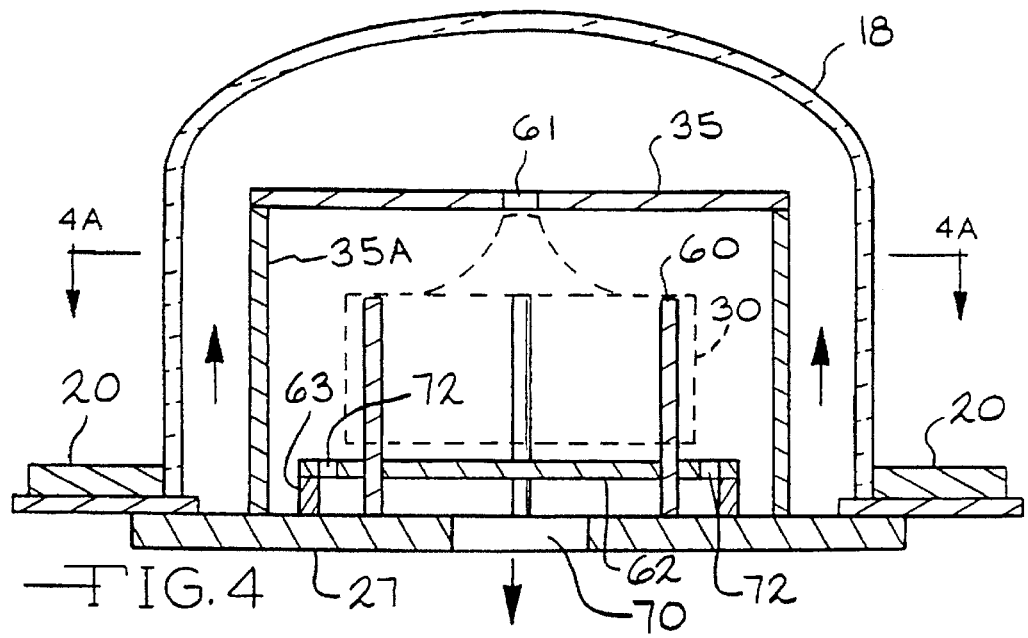
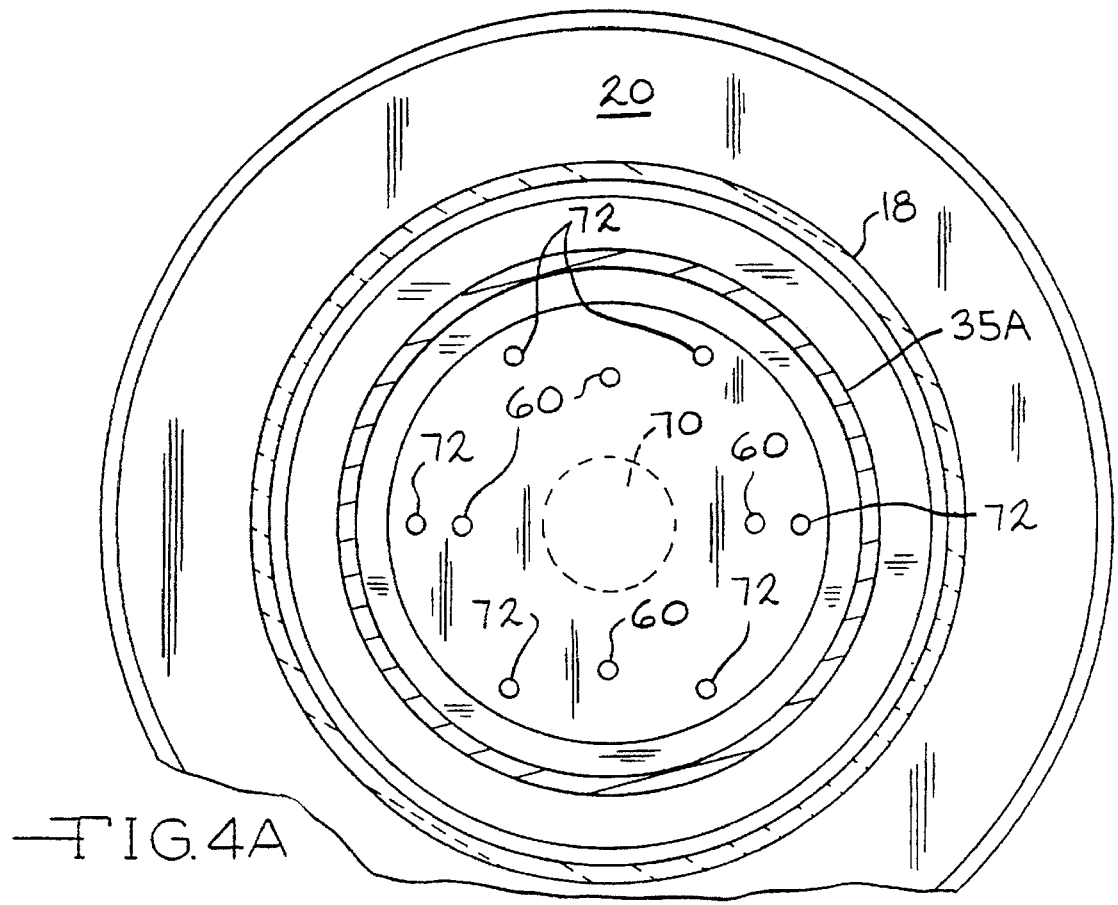

METHOD AND APPARATUS FOR PLASMA TREATMENT OF A SURFACE

This is a divisional of application Ser. No. 08/418,383 filed on Apr. 7, 1995, U.S. Pat. No. 5,571,577.

BACKGROUND OF THE INVENTION

(1) Field of the Invention

The present invention relates to an apparatus and method for treatment of a surface using a plasma generated by a microwave or UHF power source wherein the plasma is focussed below an orifice leading from a chamber in a region containing a substrate. The apparatus and method generates a high power density plasma adjacent to a surface. In particular, the present invention relates to a method for the rapid deposition of a material, such as diamond, by plasma assisted chemical vapor deposition on a portion of the surface of an object with a complex geometry, such as a drill or a seal ring. The present invention preferably uses internal applicator tuning, wherein an excitation probe and sliding short are used for internal tuning to minimize the reflected microwave or UHF power and to focus the plasma in the region, when the other experimental parameters such as a substrate, a substrate holder, a substrate position, input power, gas flow, pressure, and the like are changed. This allows easy optimization of the treatment.

(2) Prior Art

Improved methods for depositing a film of a material on a substrate has always been an important goal of scientific and industrial research. The need to coat materials with thin films leads to an interest in the design and construction of an efficient apparatus.

There is no reliable commercial method which is economically feasible for diamond film deposition on complex geometries, such as drill bits and seal rings. This is primarily due to the difficulty of creating a uniform plasma around these complex geometries. This is especially true if the objects to be coated are electrically conductive. Conductive surfaces of these objects interfere with the formation of the plasma.

Diamond, having unique mechanical, optical and electrical properties, is one of the most valuable scientific and technological materials. Ever since Tennant discovered that diamond is made of carbon in 1797, synthesis of diamond has long been a goal of research effort of numerous individuals. In 1955, Bundy and co-workers succeeded in the reproducible synthesis of diamond (Bundy, F. P., et al., "Man-made diamond," Nature 176 51 (1955)) with a molten transition metal solvent-catalyst at pressures where diamond is the thermodynamically stable phase of carbon.

Diamond growth at low pressures where graphite is the stable carbon phase can be traced back to W. G. Eversole (Eversole, W. G., U.S. Pat. Nos. 3,030,187 and 3,030,188); Angus et al (Angus, J. C., et al., J. Appl. Phys. 39 2915 (1968); and Deryaguin et al (Deryaguin, B. V., et al., J. Cryst. Growth 2 380 (1968)), but the low growth rate (less than 0.1 micrometer per hour) was not practical and prevented commercial interest at that time. The breakthrough in the synthesis of diamond at low pressures came in the late 1970's and early 1980's, when a group of Soviet researchers (Spitsyn, B. V., et al., J. Cryst. Growth 52 219 (1981)) and Japanese researchers (Matsumoto, S., et al., Jpn. J. Appl. Phys. 21 part 2, 183 (1982)) published a series of research papers on diamond film growth at higher growth rate (several micrometers per hour) from hydrocarbon-hydrogen gas mixtures. Since then, numerous techniques have been developed for diamond film growth at low pressures. These techniques can be divided into five major categories: (1) thermally activated or hot filament activated chemical vapor deposition (CVD) (Matsumoto, S., et al., J. Appl. Phys. 21 part 2, L183 (1982); Matsumoto, S., et al., J. Mater. Sci. 17 3106 (1982)); (2) high frequency plasma enhanced CVD (Kamo, M., et al., J. Cryst. Growth 62 642 (1983); Matsumoto, S., et al., J. Mater. Sci., 18 1785 (1983); Matsumoto, S., J. Mater. Sci. Lett., 4 600 (1985); Matsumoto, S., et al., Appl. Phys. Lett., 51 737 (1987)); (3) direct current discharge enhanced CVD (Suzuki, K., et al., Appl. Phys. Lett., 50 728 (1987)); (4) combustion flame (Hirose, Y., et al., New Diamond 4 34 (1988)); and (5) other and hybrid techniques. All of these techniques are based on the generation of atomic hydrogen and carbon containing species near the thin film growing surface.

A very common method of synthesis is microwave plasma assisted CVD. This method has shown excellent potential for growing high quality diamond films and variations of this technique are now in common use in many laboratories and industries. Since there are no metallic electrodes present in the microwave plasma, the problem of metallic contamination in the process of diamond deposition does not exist. Compared to the erosion of electrodes in direct current reactors, microwave plasma diamond film deposition is a cleaner process. It is also easier to control and optimize the deposition process which makes microwave plasma reactors the most promising technique for stably growing pure and high quality diamond films (Deshpandey, C. V., et al., J. Vac. Sci. Technol. A7, 2294 (1989); Zhu, W., et al., Proc. IEEE 79, No. 5, 621 (1991)).

High rate diamond film deposition has been achieved by several different apparatus. A DC discharge jet diamond film reactor apparatus is shown in S. Matsumoto, et al., Jpn. J. Appl. Phys. 29 2082 (1990). In this reactor, the input gas which is a mixture of Ar, $H_2$ and $CH_4$ is dissociated by a DC voltage $V_d$ across the electrodes. A high temperature discharge jet is created and sustained by a DC power supply. The substrate is mounted downstream of the jet stream on a water-cooled substrate stage. Diamond film is formed on the substrate when the dissociated gas species react on its surface. A bias voltage $V_b$ is used to enhance the film growth rate. The typical experimental conditions are: Ar flow rate= 30 l/min, $H_2$ flow rate=10 l/min, $CH_4$ flow rate=1 l/min, pressure=140 Torr, discharge voltage=70–76 V, discharge current=133–150 A, bias voltage=0–500 V, bias current=0.5 A, substrate=Mo plate of 20 mm in diameter, distance between the substrate and nozzle=57–102 mm, substrate temperature=700°–1100° C., deposition time=10 min, substrate pretreatment=scratched with 5–10 μm particle size diamond paste for about 5 min.

A microwave jet reactor is also shown in Y. Mitsuda, et al., Rev. Sci. Instrum. 60 249 (1989) and K. Takeuchi et al., J. Appl. Phys. 71 2636 (1992). The input gas, which is a mixture of hydrocarbon, hydrogen and oxygen, is dissociated near the jet nozzle by the microwave energy. Microwave energy is transmitted from the power source to the jet nozzle through $TE_{01}$ mode in the rectangular waveguide, a transition unit and TEM mode in the coaxial waveguide. The plasma jet is generated from the end of the center plasma flow stabilizer and blows through a constriction or nozzle and into the deposition chamber where the substrate is placed on a water-cooled substrate holder. Diamond film is formed on the substrate when the dissociated gas species react on its surface. Note that the microwave discharge is created upstream from the nozzle, allowing gas by-passing of the discharge. Diamond films have been deposited under the following experimental conditions: substrate=Si, Ar flow rate=10 l/min, $H_2$ flow rate=20 l/min, $CH_4$ flow rate=0.6 l/min, $O_2$ flow rate=0.15 l/min, total pressure=760 Torr, substrate temperature=887°–927° C., microwave power= 3.8–4.2 kW. The diameters of the center and outer conductor in the coaxial waveguide are 20 and 57.2 mm, respectively. The conductors taper off and play the roles of plasma flow stabilizers for plasma generation. These stabilizers are made of water-cooled copper in order to prevent thermal evaporation. The edge of the outer electrode (plasma jet nozzle) is 22 mm in diameter, which must be designed properly depending upon the plasma gas composition.

To successfully commercialize diamond synthesis at low pressures, diamond growth at high rates is desirable. The reactors described previously can deposit diamond film and growth rates in the order of 100 μm/hour. But in these jet reactors, the reactive gases flow through a discharge which is located upstream from a nozzle. The hot gases are then forced through the nozzle and projected onto a substrate. In addition to gas flow by-passing of the discharge, there is significant amount of volume and surface recombinations of dissociated reactive species when they are forced through the nozzle. The gas flow and power efficiencies of the reactors are significantly reduced. Also, when hot gases are forced through a nozzle, the problems of nozzle erosion and/or deposition and/or melting exist.

The apparatus described in U.S. Pat. No. 5,311,103 issued to the present inventors is used to create a uniform coating on surfaces. The apparatus was difficult to use in reproducibly coating surfaces with complex geometries such as ring seals and drills. The problem was especially evident if the surface to be coated was electrically conductive. Conductive surfaces of these objects to be coated interfere with electromagnetic fields in the cavity and make it very difficult to form a plasma around the surface.

There is further a need for an apparatus and method for uniform etching of a surface with a plasma. Such etching is used for silicone chips and the like.

There is a need for a microwave apparatus for plasma deposition of diamond and diamond film coating on surfaces of objects with complex geometries, such as drill bits and seal rings. There is also a need for an apparatus and method for uniform plasma etching.

OBJECTS

It is therefore an object of the present invention to provide an apparatus and method for the treatment of a surface, particularly for the rapid plasma assisted chemical vapor deposition of diamond on a surface of an object with a complex geometry, such as drill bits and seal rings and for rapid etching of a surface. It is also an objective of the present invention to provide an apparatus and method which can deposit diamond film over wide range of experimental conditions, i.e., pressure (1 to 1000 Torr), flow (10–10,000 sccm), power (0.5 to 10 kilowatts) and on a variety of substrate types, i.e. plane surfaces, cylindrical round tools, seal rings, inserts, and the like. Further, it is an object of the present invention to provide an apparatus which is relatively economical to construct, reliable to use and which produces excellent results. These and other objects will become increasingly apparent by reference to the following description and the drawings.

DESCRIPTION OF THE DRAWINGS

FIG. 4 is a schematic front cross-sectional view of the drills 60 in a holder 63 and showing the gas outlet 70 and gas outlets 72 in the holder 63. FIG. 4A is a plan cross-sectional view along line 4A—4A of FIG. 4.

GENERAL DESCRIPTION

The present invention relates to a method for treating a substrate with a plasma which comprises: providing a plasma generating apparatus including a plasma source employing a radiofrequency, including UHF or microwave, wave coupler means which is metallic and optionally including a static magnetic field around the plasma which aids in coupling radiofrequency energy at electron cyclotron resonance and aids in confining ions in the plasma in an electrically insulated chamber means in the coupler means, mounted in closely spaced and sealed relationship to an area of the coupler means with an opening from the chamber means at one end; waveguide means for coupling the radiofrequency waves to the coupler means; and a stage means which forms part of the coupler means and provides for mounting a substrate adjacent the plasma, a conductive plate with at least one orifice mounted at the opening from the chamber between the stage means and the chamber; an inlet and an outlet for gas flow through the orifice and through the plasma to a region between the orifice and the stage means and onto the substrate, and then removal from the region; and tuning means for positioning the radiofrequency waves between the orifice and the stage means; and generating the plasma in a flow of the gas between the orifice and the stage means by tuning the radiofrequency waves which acts upon the substrate.

Further, the present invention relates to a plasma generating apparatus for treating a substrate with a plasma including a plasma source employing a radiofrequency, including UHF or microwave, wave coupler means which is metallic and optionally including a static magnetic field around the plasma which aids in coupling radiofrequency energy at electron cyclotron resonance and aids in confining ions in the plasma in an electrically insulated chamber means in the coupler means, mounted in closely spaced and sealed relationship to an area of the coupler means with an opening from the chamber means at one end; waveguide means for coupling the radiofrequency waves to the coupler means; and a stage means which forms part of the coupler means and provides for mounting a substrate adjacent the plasma, the improvement which comprises: a conductive plate with at least one orifice mounted at the opening from the chamber between the stage means and the chamber; an inlet and an outlet for gas flow through the orifice and through the plasma to a region between the orifice and the stage means and then for removal from the region; and tuning means for positioning the radiofrequency waves between the orifice and the stage means.

The apparatus and method is particularly used for etching and for deposition of materials particularly diamond thin films. Any treatment of a surface is contemplated.

Figure 1:
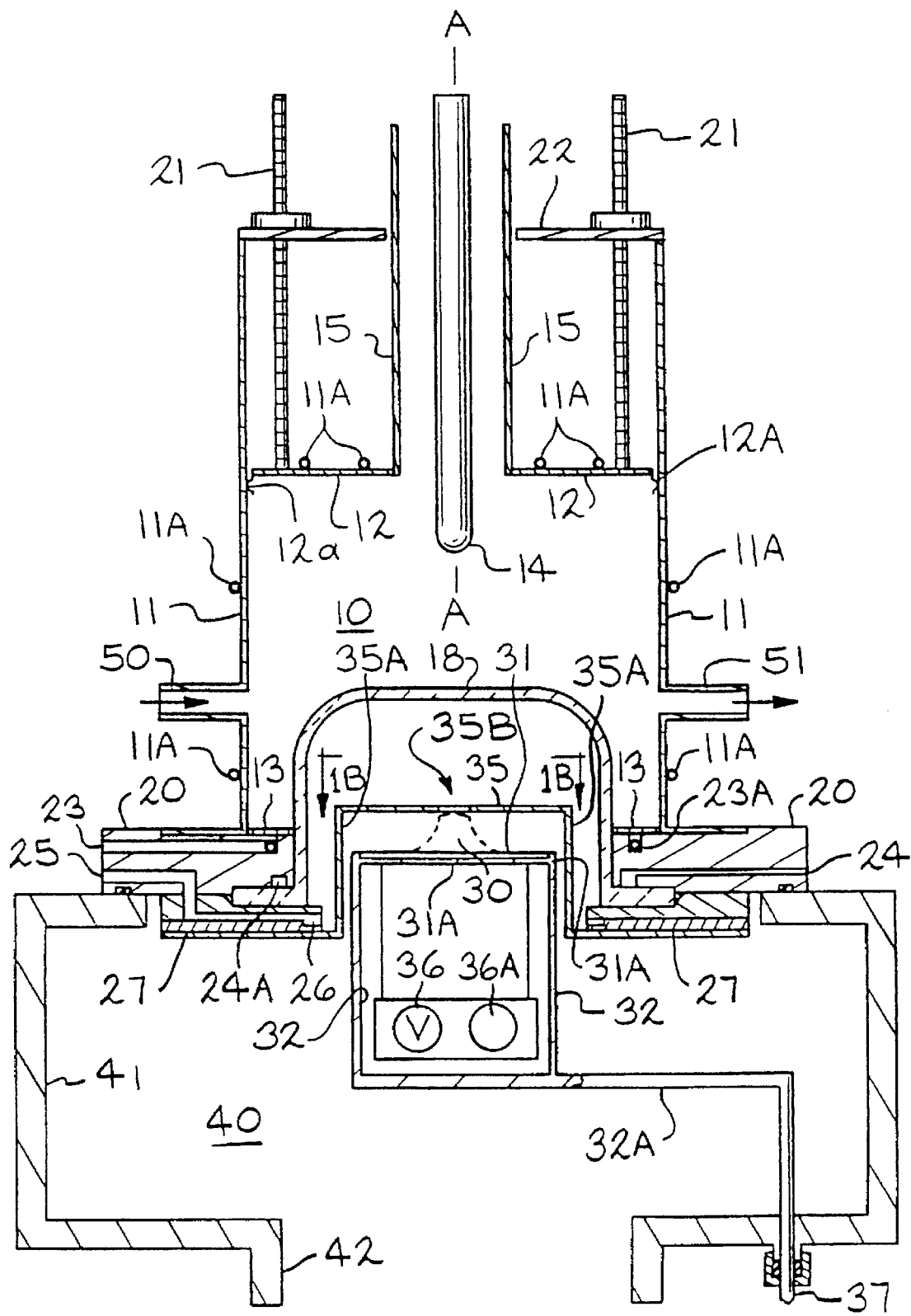
FIG. 1 is a schematic front cross-sectional view of an apparatus of the present invention for the rapid coating of a substrate 31 with a material, particularly diamond, wherein the substrate 31 being coated is supported by a graphite susceptor 31A. The susceptor 31A is mounted on a substrate support 32 which stands on a moving stage 32A used to change the position of the substrate 31. A plasma 30 is created in the region between the jet pattern controller 35 and the substrate 31 below orifice 35B by coupling microwave power into the plasma 30. The metal plate 27 and the controller support 35A are sealed together to force the source gas to flow through the orifice 35B of jet pattern controller 35 and into the plasma 30. This gas flow configuration optimizes the efficiencies of the source gas and the input power. A heater 36 or cooling system 36A is added underneath the susceptor 31A to adjust the process temperature of the substrate 31 to be coated.
Figure 1A:
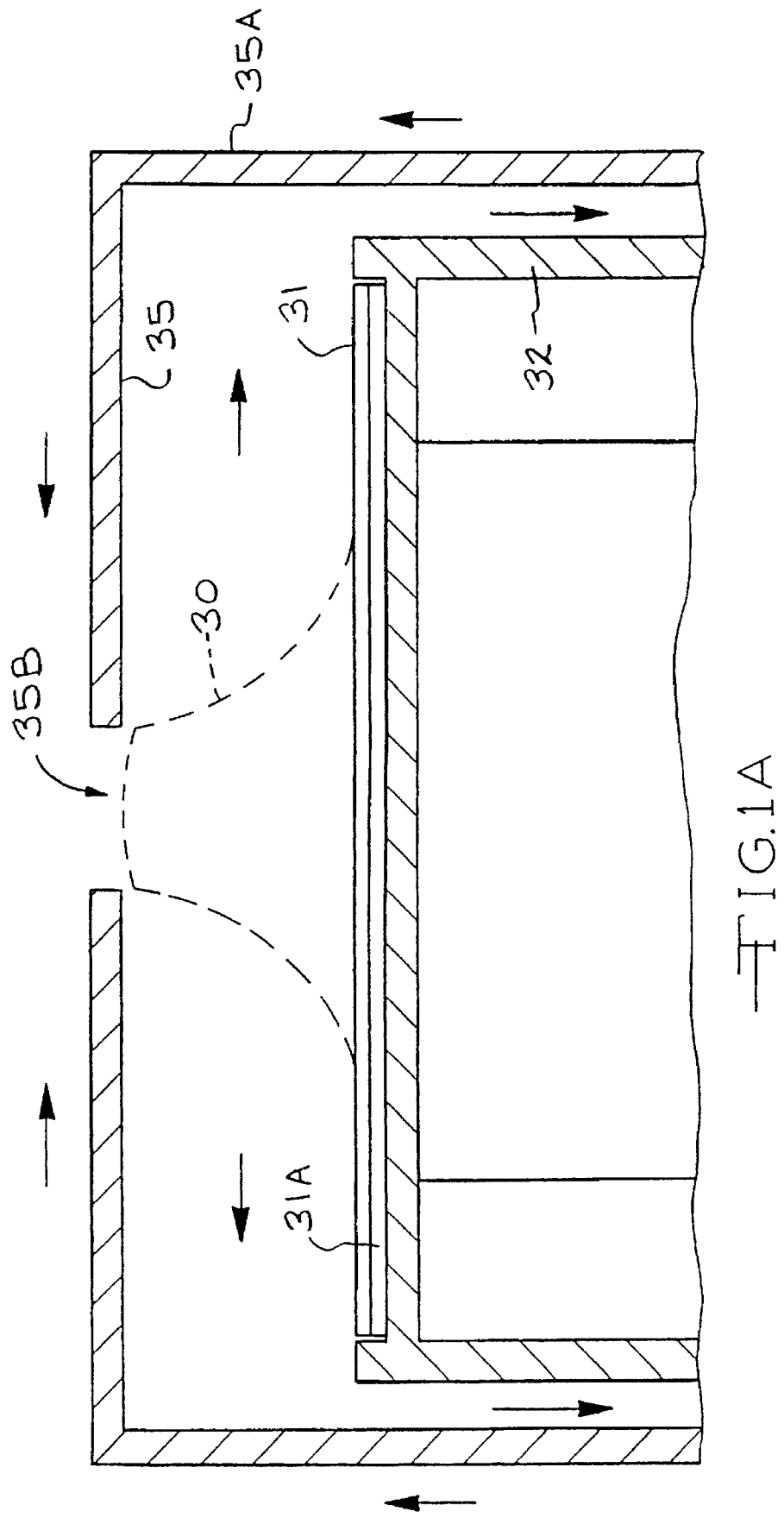
FIG. 1A is an enlarged partial sectional view of the plasma 30 region and the gas flow orifice 35B, wherein the gas flow is shown by the arrows.
Figure 1B:
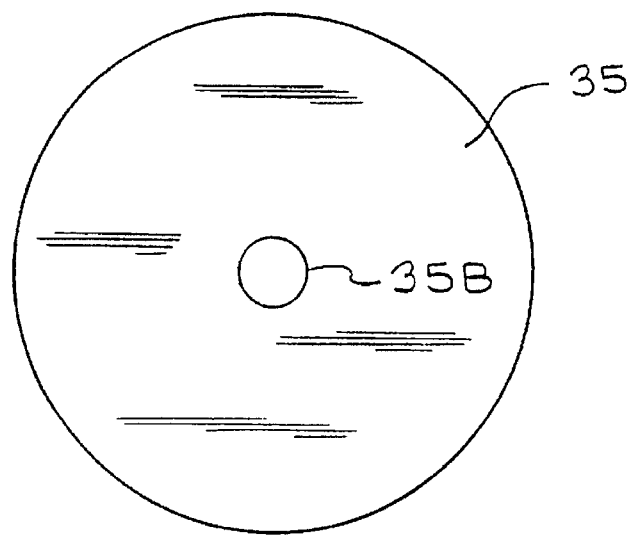
FIG. 1B is a plan view of the pattern controller 35, and orifice 35B.

FIGS. 1, 1A and 1B show the preferred improved plasma apparatus of the present invention, which has elements in common with U.S. Pat. No. 5,311,103 issued to the present inventors. The system is preferably constructed to be operated at 2.45 gigahertz. A cylindrical metallic or conductive cavity 10 is formed by side wall 11 which is 178 millimeter in inside diameter, and is open ended. Water cooling tubes 11A are provided. A sliding short 12, which is electrically connected to the side walls via the finger stocks 12A, forms top end of the cavity 10. The lower section of the cavity 10 consists of a bottom surface 13, a base-plate 20, a jet pattern controller 35, a controller support 35A, a substrate support 32, and the metal plate 27. The sliding short 12 is moved back and forth along the longitudinal axis A—A of the side wall 11 by the moving rods 21 with a conventional gear assembly (not shown). The excitation probe 14, which is housed inside the probe sleeve 15, is adjustable with respect to the sliding short 12 through a set of mechanical gears (not shown). The adjustable sliding short 12 and excitation probe 14 provide the impedance tuning mechanism to minimize the reflected power. The source gas, which is supplied through the source gas inlet 25 and annular source gas ring 26, is confined at the lower section of the cavity 10 by a quartz bell jar 18. The base-plate 20 and quartz bell jar 18 are cooled by the water cooling channel 23 and gas cooling tunnel 24 through the annular water cooling rings 23A and gas cooling rings 24A. Also the quartz bell jar 18 is cooled by cooling gas through the cooling gas inlet 50. The cooling gas flows over the quartz bell jar 18 and exits via cooling gas outlet 51.

Figure 2A:
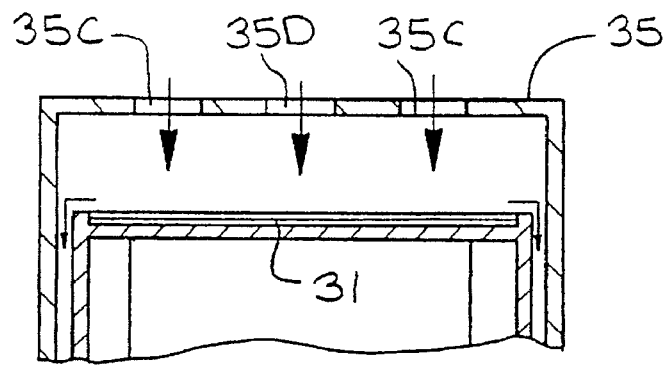
FIG. 2A shows an enlarged partial sectional view of the pattern controller 35 and plasma 30 and the gas flow orifices 35C and 35D.
Figure 2B:
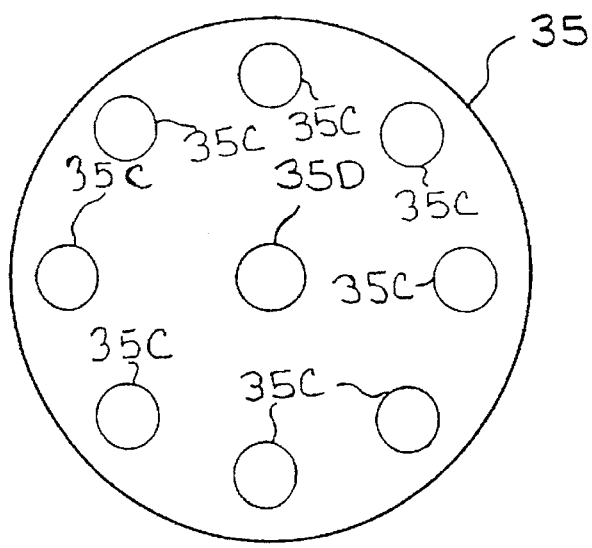
FIG. 2B is a plan view of the pattern controller 35 of FIG. 2.
Figure 2:
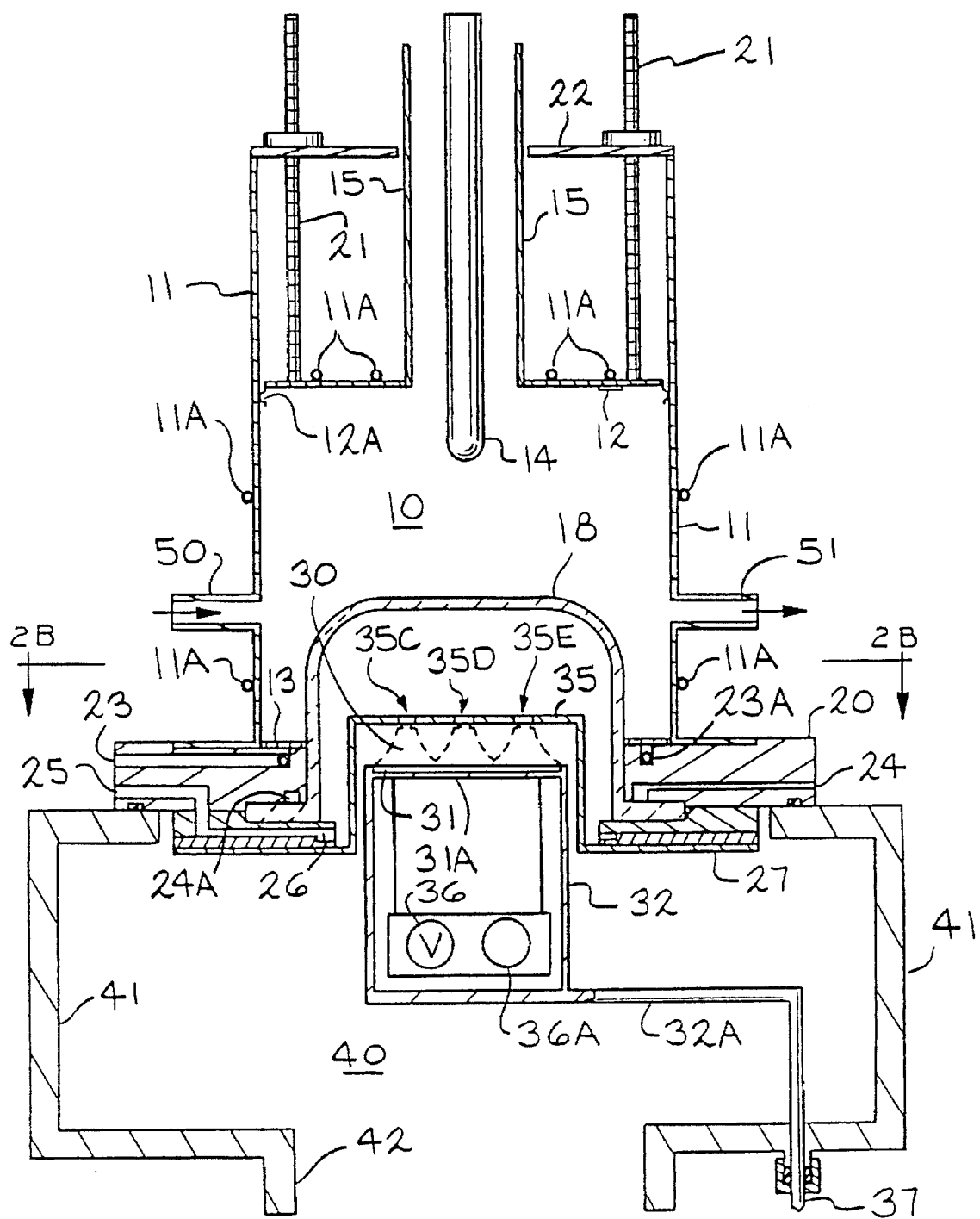
FIG. 2 is a schematic front cross-sectional view of an apparatus similar to that of FIG. 1 showing one example of a jet pattern controller 35 with multiple orifices 35C and 35D. Uniform coating over larger surface areas are achieved with an overlapping multi-jet plasma pattern through controller 35.
Figure 3:
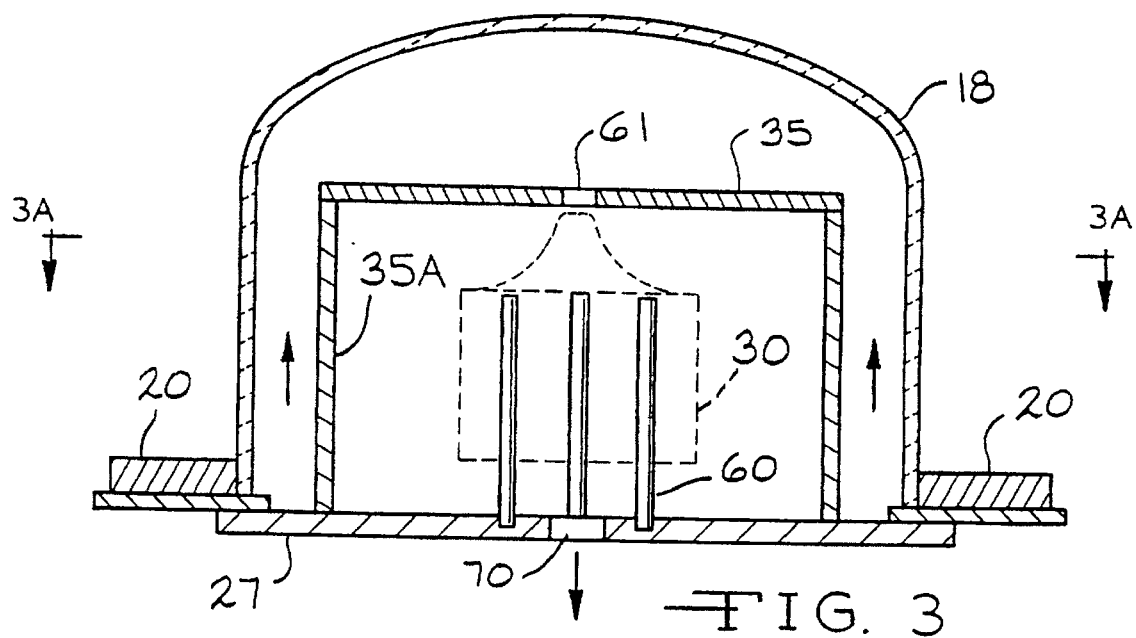
FIG. 3 is a schematic front cross-sectional view of an apparatus as shown in FIG. 1 showing drills 60 which are partially covered by the plasma 30 and showing a gas outlet 70.
Figure 3A:
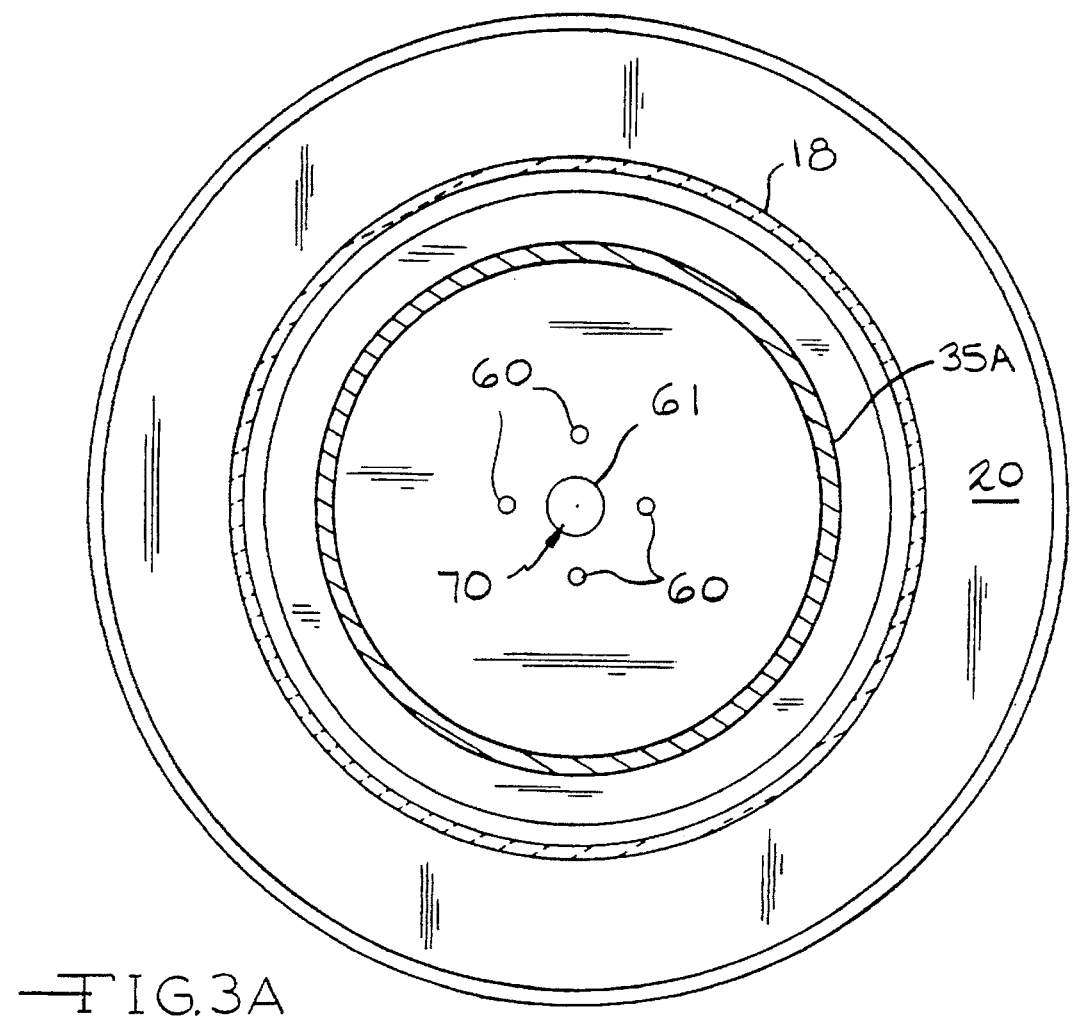
FIG. 3A is a plan cross-sectional view along line 3A—3A of FIG. 3.
Figure 5:
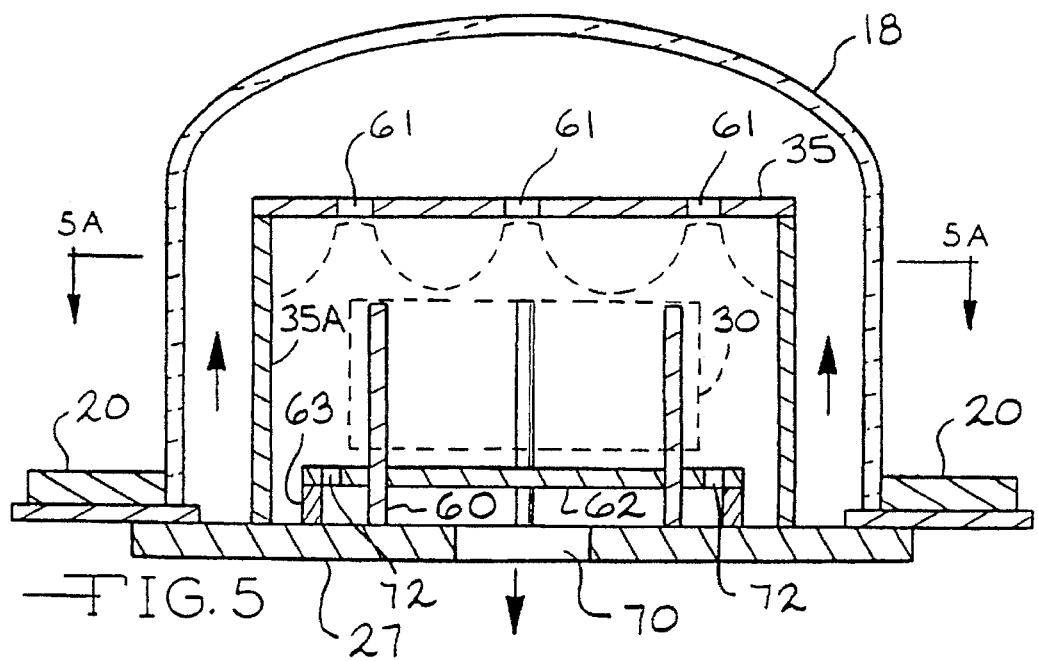
FIG. 5 is a schematic front view of an apparatus similar to that of FIG. 4 with multiple openings 61 and support 63 for drills 60.
Figure 5A:
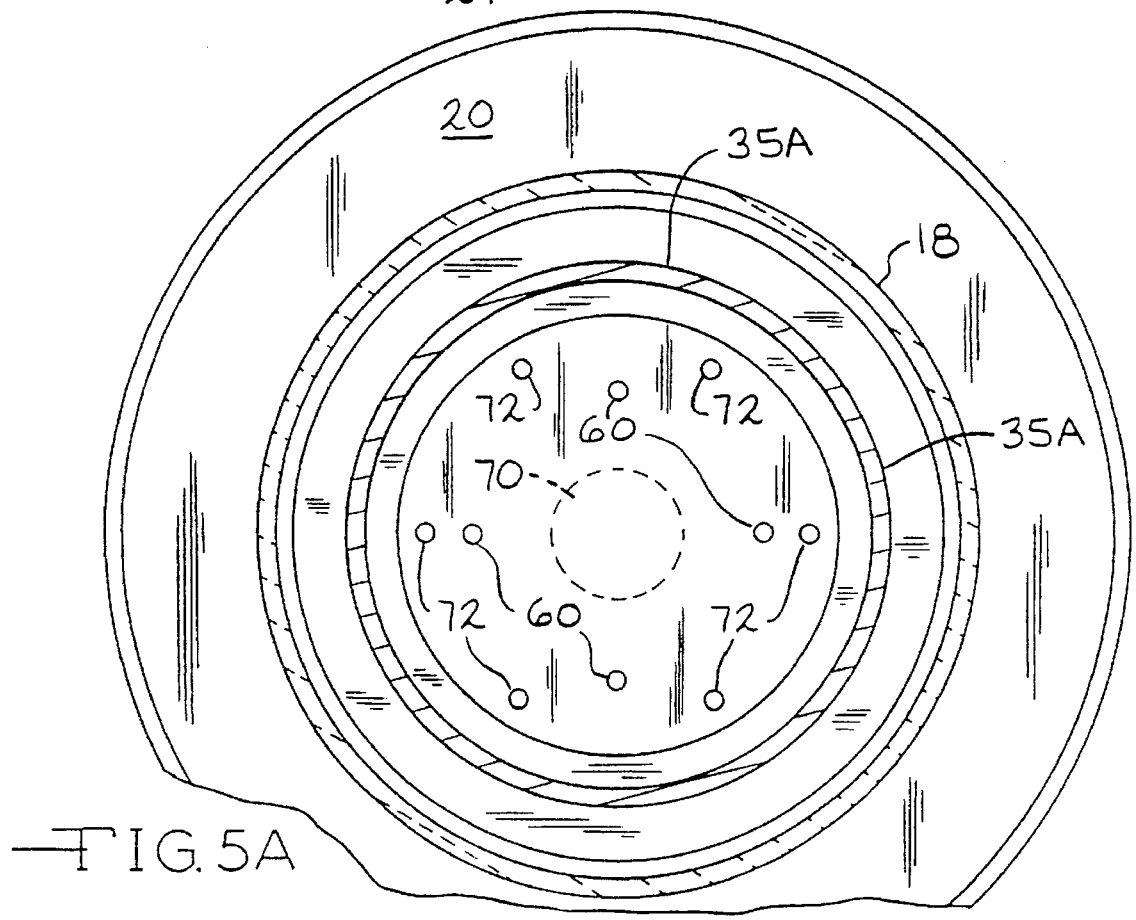
FIG. 5A is a plan view along line 5A—5A of FIG. 5.

The substrate 31 to be coated is positioned on top of a susceptor 31A (preferably graphite) which is supported by substrate support 32. The substrate support 32 stands on a moving stage 32A which is used to change the location of the substrate 31. The metal plate 27 and the controller support 35 are sealed together to force the gas to flow through the jet pattern controller 35, which is a plate with an orifice 35B. A plasma 30 is created in the region between the jet pattern controller 35 and the substrate 31 below opening 35B by coupling microwave power into this region. This construction minimizes the plasma 30 volume by creating a high power density plasma 30 adjacent to the substrate 31. The size and power density of the plasma 30 are controlled by variation in input power, pressure, gas flow and substrate 31 position. The jet pattern controller 35 directs the way that the gas flows through the plasma 30 and onto the substrate 31. This configuration optimizes the efficiency of the source gas since there is no gas flow by-passing of the discharge as in the prior art devices. A heater 36 or cooling channel 36A which can be either a heater or liquid or gas cooling channel placed underneath the substrate, can be used to control the process temperature of the substrate 31. The apparatus is mounted on a vacuum chamber 40 with chamber walls 41 and a chamber conduit 42 leading to a vacuum pump (not shown). FIG. 1A shows the close-up view of the plasma 30 region and the gas flow orifice 35B. FIG. 1B shows the orifice 35B. FIGS. 2 and 2A show one example of a jet pattern controller 35 with a multi-jet configuration formed below orifices 35C and 35D. Uniform coating over larger surface areas can be achieved with overlapping orifices in multi-jet pattern controller 35. FIG. 2A is an enlarged view of the controller 35 with arrows showing the gas flow. FIG. 2B shows the plan view of the controller 35 and orifices 35C and 35D.

Figure 6:
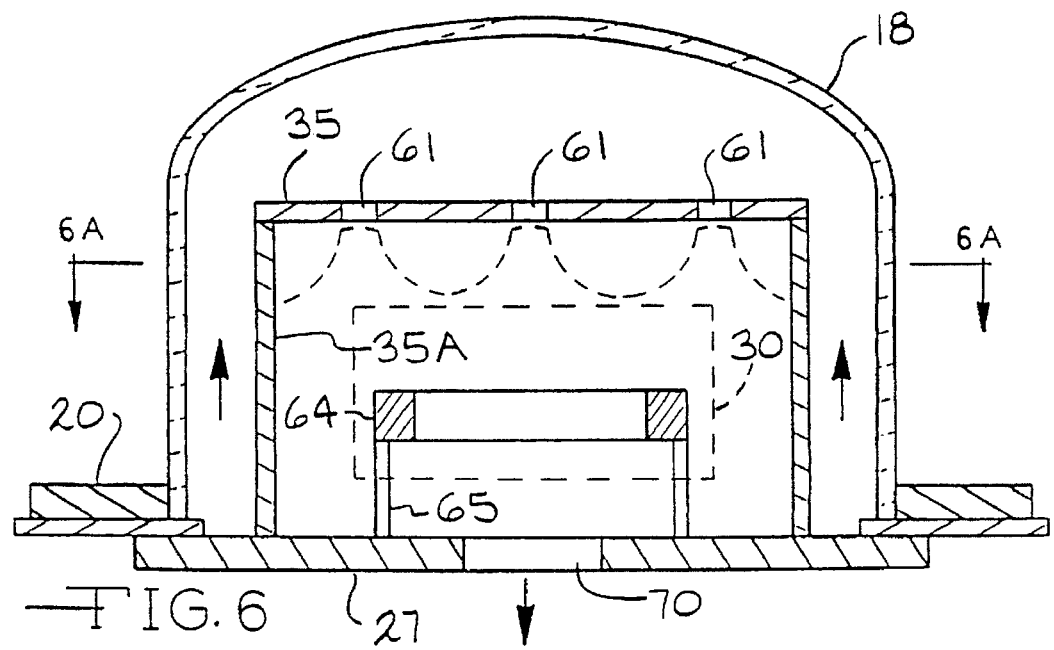
FIG. 6 is a schematic front view of an apparatus such as shown in FIG. 4, wherein a ring seal 64 on a holder 65 is provided in the plasma 30.
Figure 6A:
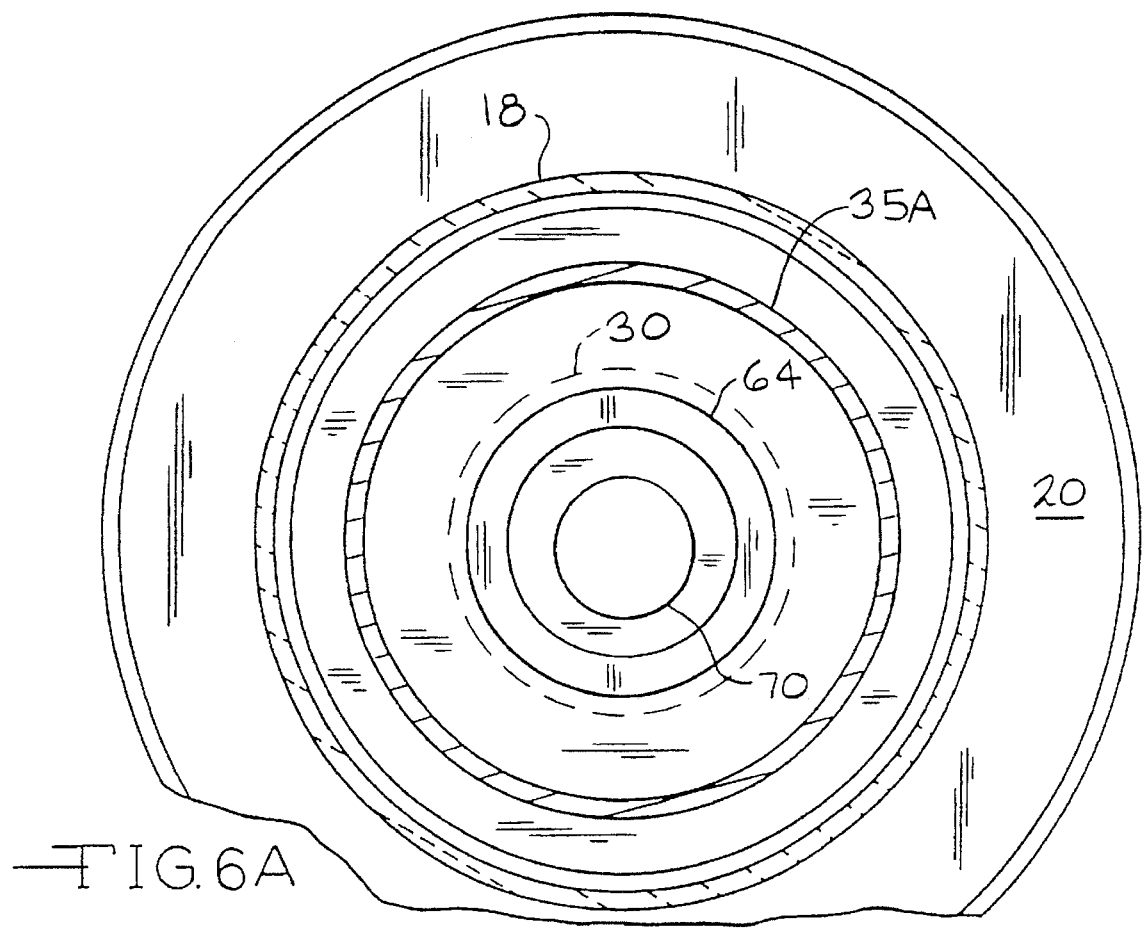
FIG. 6A is a plan view along line 6A—6A of FIG. 6.

FIGS. 3, 3A, 4, 4A, 5, 5A, 6 and 6A show the configurations where the reactor apparatus and method are used to uniformly coat objects with complex geometries, such as round (cylindrical) cutting tools. With an optimized multi-jet pattern controller 35, the plasma 30 is created to surround the objects (cylindrical round cutting tool or drill 60) such that uniform coatings are obtained. The tool holder 62 and holder support 63 are used to position the drill 60 and to mask portions which are not to be coated. FIG. 6 shows other objects such as seal rings 64 which are coated with the reactor apparatus and method. These rings 64 are placed on the ring holders 65. Gas flows through orifices 61 and out through gas outlet 70. Holder 63 can include intermediate gas outlets 72.

The experimental microwave circuit used to deliver power into the reactor is described in U.S. Pat. No. 5,311,103 issued to the present inventors. It primarily includes (1) a 2.45 gigahertz, variable power source, (2) circulators and matched dummy loads, (3) directional couplers and power meters that measure the incident power $P_i$, and reflected power $P_r$, from which the power absorbed by the reactor is given by $P_r=P_i-P_r$, and (4) the coaxial excitation probe 14 and the cavity 10.

EXAMPLE 1

A reactor apparatus having a cavity 10 with a 178 millimeter inside diameter wall 11, a quartz jar 18 with a 127 millimeter inside diameter, and an end power feed probe 14 with a 41 millimeters inside diameter sleeve 15 was built and used for diamond film growth. A high power density discharge was created with 550 sccm hydrogen and 14 sccm methane gas flow at 120 Torr with 4000 Watts 2.45 GHz power absorbed. Diamond films have been deposited on silicon wafers with a linear growth rate of greater than 100 μm/hour on an exposed portion of the substrate.

Adherent and uniform diamond films were deposited on cylindrical round cutting tools (drills 60) and ring seals (seal 64) under a range of experimental conditions simultaneously: gas flow rates: $H_2$=400 & 600 sccm, $CH_4$=1,2,3 & 4 sccm, $CH_4/H_2$=0.25%, 0.5% & 1%; pressures: 20, 25, 30 & 40 Torr; jet nozzle sizes: 1/16", 1/8" & 1/4"; quartz tube lengths: 6 cm, 7 cm & 9 cm; tool sizes: lengths: 2" & 2.5", diameter: 5/8" & 1/4"; number of tools coated: 1, 2 & 4; substrate temperature: 745° C.–970° C.; microwave power: 0.36–1.25 kilowatts.

EXAMPLE 2

Uniform diamond films were deposited on four (4) round tools together under the following experimental conditions: $H_2$=400 sccm, $CH_4$=2 sccm, pressure=25 Torr, 2.45 GHz power absorbed=660 Watts, nozzle size=0.25", number of tools=4, tools diameter=0.25", tool length=2.5", substrate temperature=800° C. as in FIG. 5.

The present invention preferably uses a microwave plasma disk reactor (MPDR), described in the prior art. They include: (1) cylindrical cavity, (2) internal matching, i.e., sliding short and variable probe; (3) excitation of $TM_{01n}$ modes for deposition of films.

The present invention offers advantages over the apparatus described in the prior art. It ensures that only the plasma adjacent to the substrate is produced. Thus the discharge volume is optimized. It is not any bigger than necessary, resulting in optimized efficiency of the input microwave power. The source gas is forced to flow through the plasma and hence the efficiencies of the input power and source gas are optimized. This is a different method of creating a plasma jet discharge from those described in the prior art. In the jet reactors described in the prior art, the reactive gases flow through a discharge which is located upstream from a nozzle. The hot gases are then forced through the nozzle and projected onto a substrate. In the present reactor apparatus, the reactive gases are forced to flow through an orifice or nozzle 35B (35C and 35D) first. After which they are dissociated through a plasma 30 which is located adjacent to but down-stream from the orifice 35B. The dissociated reactive species are then projected onto the substrate 31. In the jet reactors described in the prior art, there is significant amount of volume and surface recombinations of dissociated reactive species when they are forced through an orifice or nozzle. The gas flow and power efficiencies of the reactors are significantly reduced. Also, when hot gases are forced through a nozzle as in the prior art, the problems of erosion and/or deposition and/or melting exist. On the other hand, in reactor apparatus of the present invention where the plasma 30 is located downstream from the orifice 35B, the problem of recombination in the nozzle does not exist. The input gas flow serves as a natural cooling agent to the orifice 35B and the problems of erosion, deposition and melting are drastically reduced or eliminated.

Since the plasma created by this apparatus and method is relatively independent of the geometry and properties of the substrates 31 to be coated, it therefore becomes possible to use this method to coat objects with complex geometries, such (cylindrical) drills 60 and seal rings 64. More importantly, uniformly coatings have been achieved.

Diamond films are uniformly deposited on a batch (1–1000) of round (cylindrical) cutting tools and seal rings using the configurations displayed in FIGS. 3, 4, 5 and 6. The operating conditions are in the range of pressure 0.1–100 Torr, gas flow 10–100,000 sccm, microwave or UHF power 0.1–100 kilowatts. The number of tools or rings coated is in the range of 1–1000 at a time. For example, by dropping the excitation frequency to 915 MHz, a 13" diameter plasma has been created in a reactor apparatus with an 18" cavity. If the nearest tools are placed 1" apart, more than 130 tools can be simultaneously coated in this reactor apparatus. By placing the tools closer or dropping the excitation frequency further, more tools can be simultaneously coated by this reactor apparatus and method.

It is intended that the foregoing description be only illustrative of the present invention and that the present invention be limited only by the hereinafter appended claims.

We claim:

1. In a plasma generating apparatus for treating a substrate with a plasma including a plasma source employing a radiofrequency, including UHF or microwave, wave coupler means which is metallic and optionally including a static magnetic field around the plasma which aids in coupling radiofrequency energy at electron cyclotron resonance and aids in confining ions in the plasma in an electrically insulated chamber means in the coupler means, mounted in closely spaced and sealed relationship to an area of the coupler means with an opening from the chamber means at one end; waveguide means for coupling the radiofrequency waves to the coupler means; and a stage means which forms part of the coupler means and provides for mounting a substrate adjacent the plasma, the improvement which comprises:

(a) a conductive plate with at least one orifice mounted at the opening from the chamber between the stage means and the chamber;

(b) an inlet and an outlet for gas flow through the orifice and through the plasma which is in a region between the orifice and the stage means and then removal from the region; and (c) tuning means for positioning the radiofrequency waves between the orifice and the stage means.

2. The apparatus of claim 1 wherein the conductive plate has multiple orifices.

3. The apparatus of claim 1 wherein the substrate is to be coated with a diamond film and wherein a holder is provided for the substrate which acts to mask a portion of the substrate.

4. The apparatus of claim 3 wherein the holder is for at least one drill and so that a cutting portion of the drill can be coated with the diamond film and a holding portion of the drill opposite the cutting portion can be masked by the holder.

5. The apparatus of claim 4 wherein the outlet is a second orifice below the holder so that the gas flow can be in the region between the orifice and the second orifice adjacent the holder which leads outside of the region.

6. The apparatus of claim 5 wherein the second orifice is below the orifice in a line through the region.

7. The apparatus of claim 1 wherein the substrate is to be coated with a diamond film and wherein a holder is for a ring seal which can be mounted on the holder provided for the substrate.

8. The apparatus of claim 7 wherein there is a second orifice below the orifice so that the gas flow can be in the region between the orifice and the second orifice adjacent the holder which leads outside of the region.

9. The apparatus of claim 8 wherein the second orifice is below the orifice in a line through the region.

* * * * *